(12) United States Patent
Gouk et al.

(10) Patent No.: US 9,490,125 B2
(45) Date of Patent: Nov. 8, 2016

(54) METHODS FOR FORMING A MOLECULAR DOPANT MONOLAYER ON A SUBSTRATE (71) Applicant: Applied Materials, Inc., Santa Clara, CA (US)

(72) Inventors: Roman Gouk, San Jose, CA (US); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/758,784

(22) PCT Filed: Jan. 6, 2014

(86) PCT No.: PCT/US2014/010324
§ 371 (c)(1),
(2) Date: Jun. 30, 2015

(87) PCT Pub. No.: WO2014/120392
PCT Pub. Date: Aug. 7, 2014

(65) Prior Publication Data
US 2015/0380249 A1 Dec. 31, 2015

Related U.S. Application Data (60) Provisional application No. 61/758,546, filed on Jan. 30, 2013.

(51) Int. Cl.
*H01L 21/225* (2006.01)
*H01L 29/66* (2006.01)
*H01L 21/02* (2006.01)

(52) U.S. Cl.
CPC ..... *H01L 21/2254* (2013.01); *H01L 21/02043* (2013.01); *H01L 21/02057* (2013.01); *H01L 21/02101* (2013.01); *H01L 29/66795* (2013.01); *H01L 29/66803* (2013.01)

(58) Field of Classification Search
CPC . H01L 21/22; H01L 21/225; H01L 21/2225; H01L 21/2254; H01L 21/2255; H01L 21/2257; H01L 29/66803
See application file for complete search history.

(56) References Cited

U.S. PATENT DOCUMENTS 4,821,997 A * 4/1989 Zdeblick ............... F15C 3/04
137/486
2004/0137167 A1 7/2004 Nguyen
(Continued)

FOREIGN PATENT DOCUMENTS

KR 1020070087574 6/2007

OTHER PUBLICATIONS

International Search Report and Written Opinion dated Apr. 30, 2014 for Application No. PCT/US2014/010324.

*Primary Examiner* — Bryan Junge
(74) *Attorney, Agent, or Firm* — Patterson & Sheridan, LLP (57) ABSTRACT

Methods for forming a conformal dopant monolayer on a substrate are provided. In one embodiment, a method for forming a semi-conductor device on a substrate includes forming a charged layer on a silicon containing surface disposed on a substrate, wherein the charged layer has a first charge, and forming a dopant monolayer on the charged layer, wherein dopants formed in the dopant monolayer include at least one of a group III or group V atoms.

18 Claims, 4 Drawing Sheets

(56) References Cited

U.S. PATENT DOCUMENTS

| | | |
|---|---|---|
| 2007/0087574 A1 | 4/2007 | Gupta et al. |
| 2009/0203197 A1 | 8/2009 | Hanawa et al. |
| 2010/0099231 A1 | 4/2010 | Siprak |
| 2011/0124187 A1* | 5/2011 | Afzali-Ardakani . H01L 21/2254 438/565 |
| 2013/0115763 A1* | 5/2013 | Takamure ......... H01L 21/02129 438/513 |

* cited by examiner

METHODS FOR FORMING A MOLECULAR DOPANT MONOLAYER ON A SUBSTRATE

BACKGROUND OF THE INVENTION

1. Field of the Invention

Embodiments of the present invention generally relate to methods for forming semiconductor devices. More particularly, embodiments of the present invention generally relate to methods for forming a molecular dopant layer on a semiconductor substrate.

2. Description of the Related Art

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. Recently, complementary metal oxide semiconductor (CMOS) FinFET devices have been widely used in many logic and other applications and are integrated into various different types of semiconductor devices. FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

Currently, an ion implantation process is often used to provide dopants into desired regions of the substrate, referred to as a beamline process. In the beamline process, various substrate tilting is often used to ensure that sidewall surfaces of the features formed on the substrate are satisfactorily implanted. However, at high substrate tilt angles, the side walls of closely packed structure may not fully exposed to the ion beam, which undesirably leads to non-uniform/non-conformal distribution of the dopant material. This non-uniform/non-conformal doping profile may create issues including non-uniform device turn on voltages.

Therefore, there is a need for an improved conformal doping process for FinFET device fabrication.

SUMMARY OF THE INVENTION

Methods for forming a conformal dopant monolayer on a substrate are provided. In one embodiment, a method for forming a semiconductor device on a substrate includes forming a charged layer on a silicon containing surface disposed on a substrate, wherein the charged layer has a first charge, and forming a dopant monolayer on the charged layer, wherein dopants formed in the dopant monolayer include at least one of a group III or group V atoms.

In another embodiment, a method for forming a semiconductor device on a substrate includes immersing a substrate having a semiconductor fin formed thereon in a first treatment solution containing aminosilane, immersing the substrate in a second treatment solution containing group III or group V anions to form a dopant monolayer on the substrate, forming a capping layer on the dopant monolayer, and performing a thermal annealing process on the substrate.

In yet another embodiment, a method for forming a dopant monolayer on a substrate includes forming a positive charge layer having cations on a semiconductor fin disposed on a substrate, disposing a treatment solution on the positive charge layer, wherein the treatment solution comprises anions, and forming a capping layer on the dopant monolayer that comprises the cations and the anions.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

As will be explained in greater detail below, a conformal molecular monolayer doping process is performed on a substrate to dope dopants into a surface of a substrate. The term "substrate" as used herein refers to body having a layer of material that serves as a basis for subsequent processing operations and includes a surface to be cleaned for forming a metal silicide layer thereon. For example, the substrate can also include one or more semiconductor and/or dielectric materials, such as silicon, silicon oxide, doped silicon, germanium, gallium arsenide, glass, sapphire, silicon dioxide, organosilicates, and carbon doped silicon oxides or the like. Optionally, the substrate can include one or more conductive metals, such as aluminum, copper, tungsten, or combinations thereof. Further, the substrate can include any other materials such as metal nitrides, metal silicide and metal alloys, depending on the application. In one or more embodiments, the substrate can have a semiconductor fin formed thereon and a conformal dopant monolayer formed thereon to receive dopants to be doped therein so as to facilitate subsequently forming a FinFET gate structure as needed. Moreover, the substrate is not limited to any particular size or shape. The substrate can be a round wafer having a 200 mm diameter, a 300 mm diameter, a 450 mm diameter, or other diameter. The substrate can also be any polygonal, square, rectangular, curved or otherwise non-circular workpiece, such as a polygonal glass substrate used in the fabrication of flat panel displays.

Figure 1:
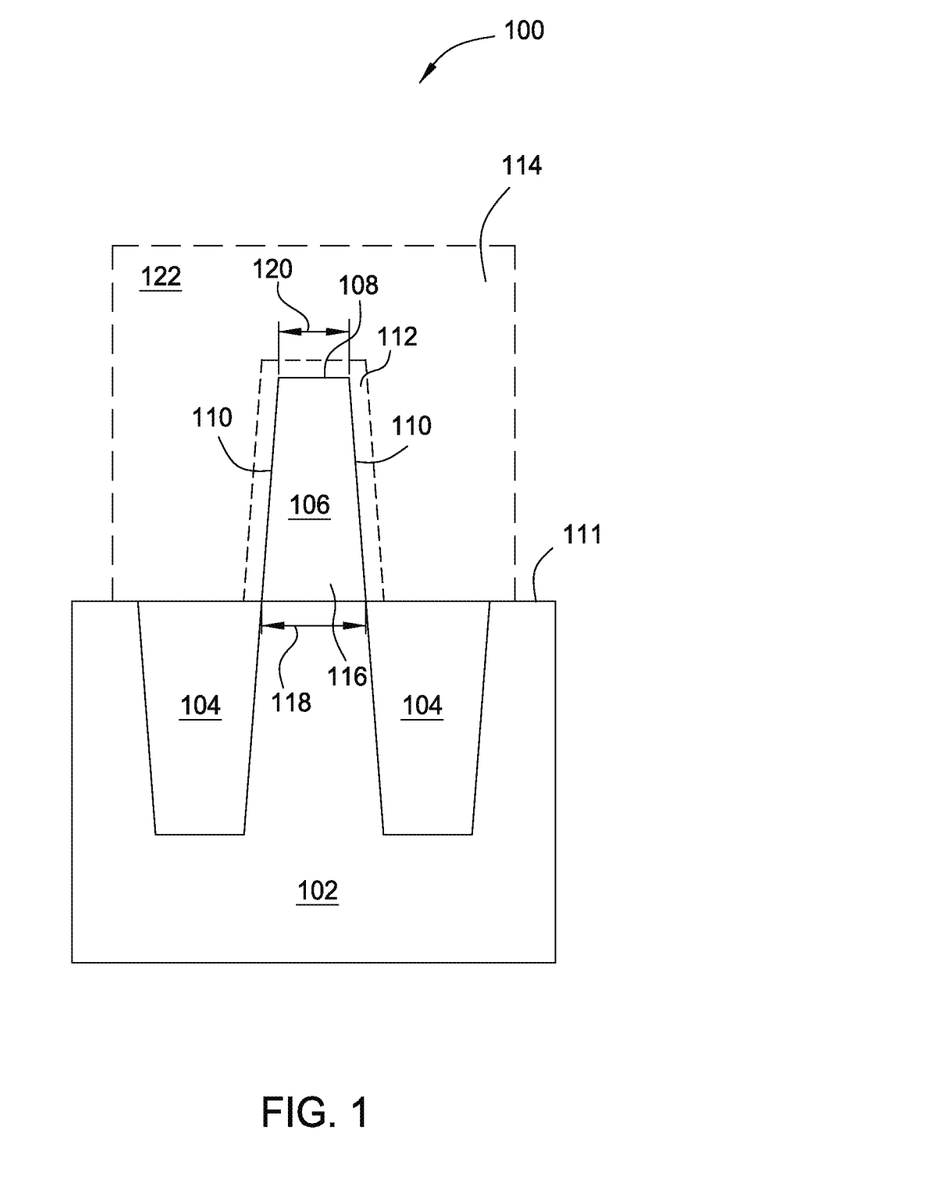
FIG. 1 is a cross section view of a FinFET device formed on a substrate which may utilize the present invention.

FIG. 1 depicts a cross-sectional view of a FinFET device 100 formed on a substrate 102. The FinFET device 100 includes isolation regions, such as shallow trench isolation (STI) regions 104, formed therein. A semiconductor fin 106 extends above the substrate 102 from a surface 111 of the substrate 102. The semiconductor fin 106 includes a top surface 108 and a bottom 116 that are connected by sidewalls 110. The sidewalls 110 of the semiconductor fin 106 may be sloped so as to have the bottom 116 of the semiconductor fin 106 having a width 118 wider than a width 120 defined by the top surface 108. Source and drain regions (not shown) may be formed at the two opposing ends of the semiconductor fin 106.

A gate dielectric layer 112 and a gate electrode layer 114 (shown by the dotted lines) may then be deposited on the semiconductor fin 106 to form a gate structure 122 somewhere along the length of the fin 106. In one embodiment, the gate dielectric layer 112 may be fabricated from a dielectric material, such as $SiO_2$, an oxide layer, a nitride layer, titanium nitride layer, a composite of oxide and nitride layer, at least one or more oxide layers sandwiching a nitride layer, and combinations thereof, among others. Alternatively, the gate dielectric layer 112 may be a high-k material having a dielectric constant greater than 4. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. The gate electrode layer 114 may be a polysilicon layer, a doped silicon layer, such as n-type or p-type doped silicon, or other suitable silicon containing material. In yet another embodiment, the gate electrode layer 114 may be a composite film including a polysilicon layer disposed on a metal material.

Subsequently, some portion of the gate dielectric layer 112 and the gate electrode layer 114 may be patterned to expose certain regions of the semiconductor fin 106 and/or gate dielectric layer 112. The exposed semiconductor fin 106 may then be doped to have dopants incorporated therein to form a doped semiconductor fin 106 with a desired dopant concentration and conductivity. The semiconductor fin 106 may be doped utilizing the conformal monolayer doping process as discussed below with referenced to FIGS. 2-3F. Alternatively, the dopants may be doped or incorporated into the semiconductor fin 106 prior to the deposition of the gate dielectric layer 112 and the gate electrode layer 114 as needed using the processes described herein. It is noted that the conformal monolayer doping process may be performed in any order or in any stage prior to, between, or after the gate manufacture process is performed as needed.

Figure 2:
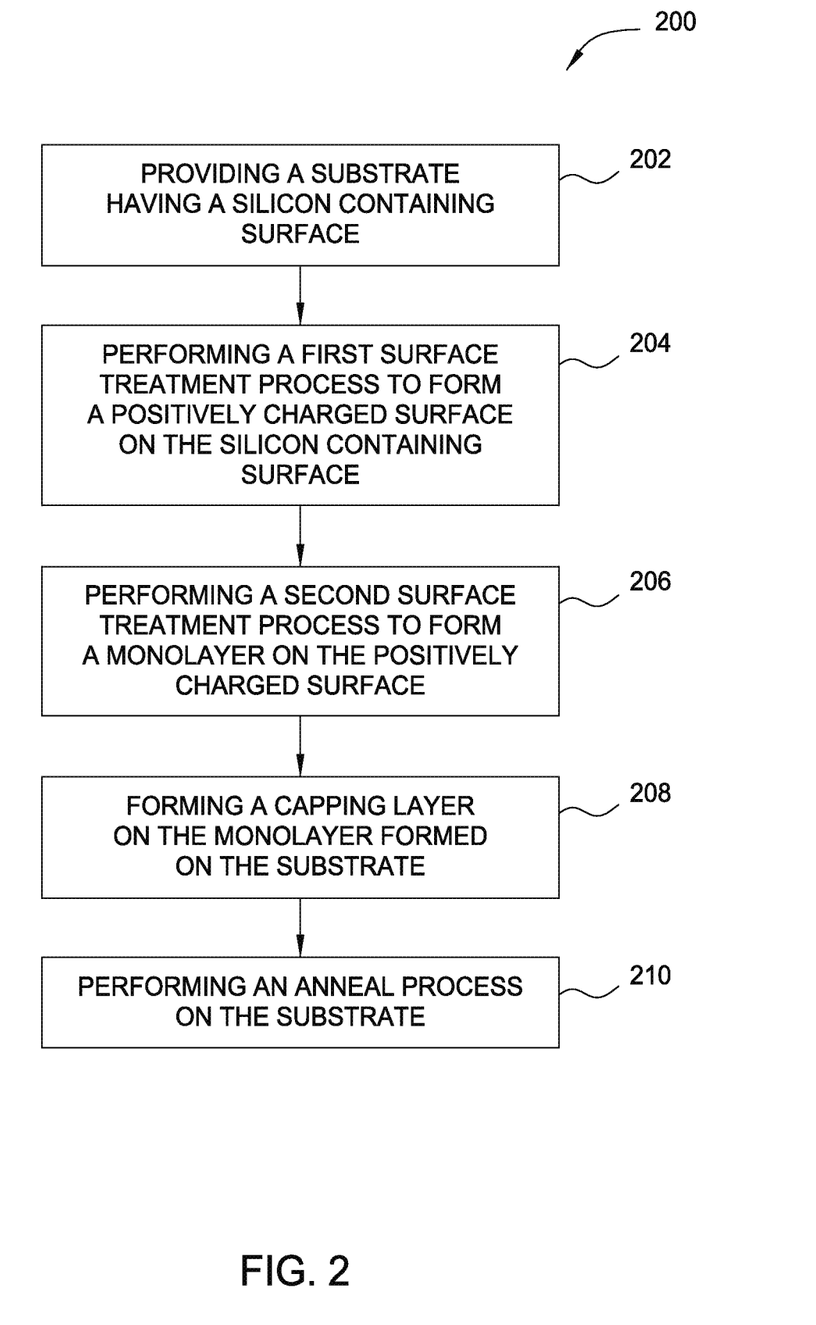
FIG. 2 depicts a flow diagram for forming a dopant monolayer on a semiconductor substrate in accordance with one embodiment of the present invention.

FIG. 2 illustrates a process sequence 200 used to form a dopant monolayer on a substrate and thus incorporate dopants into the substrate. The sequence described in FIG. 2 corresponds to the fabrication stages depicted in FIGS. 3A-3F, which is discussed below. FIGS. 3A-3F illustrate schematic cross-sectional views of a substrate 300 having a semiconductor fin 304, similar to the semiconductor fin 106 discussed above in FIG. 1, formed thereon during different stages of forming a dopant monolayer on the substrate using the processing sequence 200 to form at least part of improved FinFET structure.

Figure 3A:
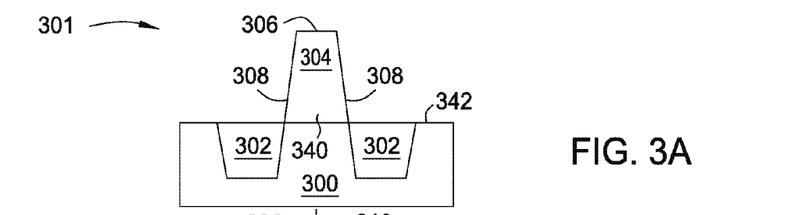
FIGS. 3A-3F depict cross-sectional views of a semiconductor device during the formation of a dopant monolayer depicted in FIG. 2 in accordance with one embodiment of the present invention.

The process sequence 200 starts at step 202 by providing a substrate, such as the substrate 300 depicted in FIG. 3A, having a semiconductor device 301 formed therein. The semiconductor device 301 includes a semiconductor fin 304 disposed between isolation regions 302, such as shallow trench isolation (STI) regions, formed therein. The semiconductor fin 304 includes a top surface 306 and a bottom 340 that are connected by the sidewalls 308 extending from a surface 342 of the substrate 300. In one embodiment, the substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a 301 structure is utilized for the substrate 300, the substrate 300 may include a buried dielectric layer disposed on a silicon crystalline substrate. In the embodiment depicted herein, the substrate 300 may be a crystalline silicon substrate.

In one embodiment, the isolation regions 302 may be fabricated from a dielectric material, such as silicon oxide materials or the like. The semiconductor fin 304 may be a polysilicon layer, a doped silicon layer, or other suitable silicon containing material. In one particular embodiment depicted herein, the semiconductor fin 304 may be a crystalline silicon layer, amorphous silicon, doped silicon layer, silicon germanium layer, a III-V compound semiconductor comprising a group-III element and a group-V element, such as GaAs, GaN, GaP, InGaAs, InP, InAlAs, GaSb, AlAs, AlP, combinations thereof, and the like. In one particular embodiment depicted herein, the semiconductor fin 304 is a crystalline, monocrystalline, or nanocrystalline silicon layer that may have dopants doped therein to form n-type semiconductor fin or a p-type semiconductor fin. The dopants may be doped by the dopant monolayer formation process discussed herein.

As illustrated in FIGS. 3A-3F, the semiconductor fin 304 may be completely exposed so that the dopant monolayer can be disposed thereon after the semiconductor fin 304 is formed on the substrate 300 and before a gate structure is formed thereover. Alternatively, as discussed above, a gate dielectric layer and/or a gate electrode layer (not shown in FIGS. 3A-3F) may be formed on the semiconductor fin 304 and then be etched/patterned to expose portion of the semiconductor fin 304 that can have the dopant monolayer disposed thereon. It is noted that the dopant monolayer formation process may be performed at any stage on any surface on the substrate 300 as needed during the semiconductor device manufacture process.

During substrate transfer, the substrate 300 may be subjected to oxidative conditions which may undesirably increase likelihood of growing native oxides on the substrate. Accordingly, prior to the dopant monolayer formation process, a pre-cleaning process may be performed to remove native oxide from the substrate 300 prior to the dopant monolayer formation process. In one embodiment, the substrate 300 may be dipped in a solution comprising a HF solution, diluted at a ratio of DI water to HF at 350:1. In another embodiment, the substrate 300 may be cleaned by any suitable cleaning technique including dry cleaning or wet cleaning processes. It is believed that the pre-cleaning process may not only eliminate contamination, but also control the surface quality/composition that may later be exposed to form the dopant monolayer.

Figure 3B:
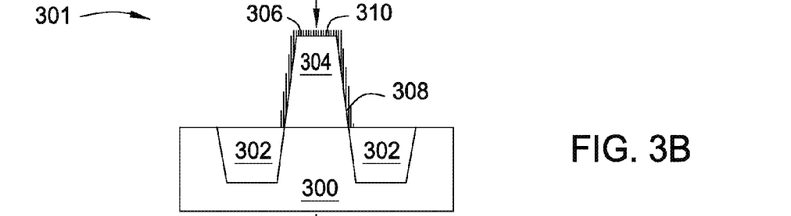

At step 204, a first treatment process is performed to change a state of surface charge of the substrate 300 (including top surface 306 and sidewalls 308 of the semiconductor fin 304 formed on the substrate). The first treatment process alters a charge state of the substrate surface, forming a positive charge surface/layer 310 on the top surface 306 and sidewalls 308 of the semiconductor fin 304, as shown in FIG. 3B. In one embodiment, the first treatment process is performed by immersing, exposing, dipping, coating, or soaking the substrate 300 into a first treatment solution including an aminosilane. The aminosilane may be provided in an acid or base solution and the substrate 300 may be immersed, exposed, dipped, coated, or soaked therein. Different species of aminosilane may be utilized to provide a silane coating monolayer onto the substrate surface, so as to create the positive charge surface/layer 310 on the top surface 306 and sidewalls 308 of the semiconductor fin 304.

It is believed that the substrate surface may have a hydroxylation surface (Si—OH) formed thereon after the pre-cleaning process or from the water and oxygen provided from the atmosphere. The hydroxylated substrate surface is homogeneous providing a uniform surface coating on the substrate surface. The hydroxylation surface (Si—OH) formed on the substrate surface may react with the silane $NH_2^-$ or $NH^-$ contained in the first treatment solution, forming a surface that has a positive charge. It is believed that this positive surface charge provided by the silane monolayer can then crosslink with anions subsequently provided thereto during the subsequent process in a reproducible manner. It is also believed that aminosilane in the first treatment solution provides a sufficient increase in the surface zeta potential in the range of 60 mV to 70 mV, by use of the first treatment solution having a pH value at 4 or lower, so as to create the positively charged surface that can crosslink to the anions that are later provided.

Suitable examples of aminosilane include N-(2-aminoethyl)-3-aminopropyltrimethoxysilane (EDA), 3-aminopropyltriethoxysilane (APS), (3-trimethoxysilylpropyl) diethylenetriamine (DETA), and the like. Aminosilane may be diluted in acid solution or base solution, such as HCl, or NaOH solutions, to a desired concentration. In one embodiment, aminosilane may be diluted in acid solution. Other suitable solutions may be utilized as well. In one particular embodiment depicted therein, the aminosilane utilized in the first treatment solution is N-(2-amino-ethyl)-3-aminopropyltrimethoxysilane (EDA) diluted in water ($H_2O$). In one embodiment, the first surface treatment process may be performed that is maintained at a temperature by exposing the substrate 300 to the first treatment solution for between about 60 seconds and about 600 seconds.

Figure 3C:
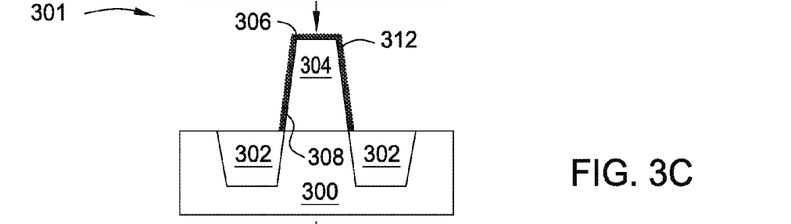

At step 206, after the first surface treatment process, the substrate 300 is then subject to a second surface treatment process. The second surface treatment process is performed by immersing, exposing, spraying, dipping, coating, or soaking the substrate 300 in a second treatment solution including dopants so as to form a dopant monolayer 312 on the substrate surface, as shown in FIG. 3C. In the embodiment wherein p-type dopants are desired to be doped into the semiconductor fin 304 so as to form a p-type FinFET, a group-III element containing treatment solution, such as boron (B), indium (In) or gallium (Ga) containing solution, may be provided in the second treatment solution. In contrast, in the embodiment wherein n-type dopants are desired to be doped into the semiconductor fin 304 so as to form a n-type FinFET, a group-V element containing treatment solution, such as phosphorus (P), nitrogen (N) or arsenic (As) containing solution, may be utilized as the second treatment solution. In one embodiment, the second surface treatment process may be performed by exposing the substrate 300 to the second treatment solution for between about 60 seconds and about 600 seconds that is maintained at a temperature of between about 0 degrees Celsius and about 100 degrees Celsius, such as between about 20 degrees Celsius and about 50 degrees Celsius.

In some embodiments, prior to performing steps 202-206, a mask pattern may be formed to expose only the regions upon which the dopant monolayer 312 of dopant atoms is desired to be formed. In one embodiment, the mask pattern is formed by depositing an oxide on the substrate and performing a photolithography and etching process to expose regions for the dopant monolayer to be diffused into. The oxide of the mask pattern may be removed by photolithography and etching steps to expose desired regions that are to be doped to form the desired gate structure 301. Alternatively, the substrate surface may only partial receive a portion of the first treatment solution, and thus be partial positively charged due to different materials from which the substrate surface is formed. By doing so, the dopant monolayer 312 may only be selectively formed on the surfaces where the first treatment solution is absorbed on the substrate surface. By utilizing different material characteristics from the substrate surface, a selective dopant monolayer formation process may be obtained to selectively form dopant monolayer 312 on certain regions of the substrate and having dopants driven/diffused only on the certain regions to form desired junction depth.

Figure 4:
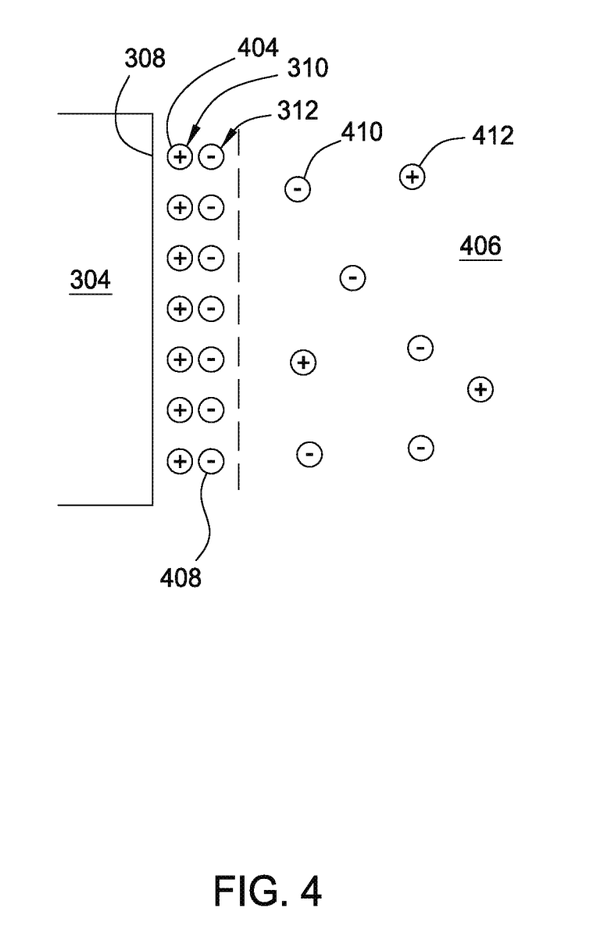
FIG. 4 depicts a magnified view of an interface during the dopant monolayer formation process depicted in FIG. 3C.

In one embodiment, the second treatment solution may include $H_3PO_4$ or $H_3AsO_4$ acid dissolved in a DI water solution with a concentration about 1 percent to 10 percent by volume. $H_3PO_4$ or $H_3AsO_4$ acid dissolved the solution forms $[PO_4]^-$ or $[AsO_4]^-$ anions and $[H^+]$ cations in the solution. As the substrate surface is positively charged, a monolayer of $[PO_4]^-$ or $[AsO_4]^-$ anions may then link with the positive charges formed on the surface due to the double layer potential that will be built on the substrate surface upon emersion in the solution, forming a monolayer 312 on the substrate 300, as shown in FIG. 3C. As further depicted in FIG. 4, the positive charge surface 310 that contains a layer of cations (+) 404 formed on the semiconductor fin 304. The positive charge cations (+) 404 will repulse excess cations (+) 412 back to solution environment 406 and attract a layer of anions (−) 408, 410 to be absorbed thereto. Once the monolayer 312 of anions 408 is formed and attached to the cations (+) 404, excess cations (+) 412 and anions (−) 410 will be repelled away from the substrate surface to be kept in the solution environment 406, called double layer potential repulsion principle. Thus, by utilizing this self-limiting nature of the monolayer formation technique forming a positive charge monolayer and then absorbing a negative monolayer on the positive charge layer, a high dose control with conformal and uniform nanoscale deposition technique may be obtained and repeatedly performed in a controllable manner. The dopants may be controllably positioned on the substrate surface by the selection and their subsequent reaction between the particular species formed in the first and the second treatment solutions. As a result, a monolayer 312 is formed on the substrate with a desired type and amount of negatively charge dopants (e.g., $[PO_4]^-$ or $[AsO_4]^-$.

In one embodiment, desired species utilized in the second treatment solution may include dopants suitable for doping into the semiconductor fin 304. Suitable dopants include boron, indium (In), gallium (Ga), germanium (Ge), phosphorus (P), nitrogen (N), arsenic (As), or the like. In one embodiment, dopants with a heavier molecular weight, such as phosphorus (P), arsenic (As), gallium (Ga) or germanium (Ge) as compared to boron, may be utilized as species contained in the second treatment solution. It is believed that dopants with heavier molecular weight may be easier to be incorporated at a depth in the substrate in the subsequent thermal processing steps, as compared to dopants with lighter molecular weight. The control of the doping depth can improve the doping efficiency within the substrate to achieve a desired doping profile and concentration in the fin 106. In one particular embodiment the species utilized in the second treatment solution are $[PO_4]^-$ or $[AsO_4]^-$ anions.

After the dopant monolayer 312 is formed on the substrate 300, the substrate 300 may be removed from the second treatment solution. Subsequently, the substrate 300 may be placed into a cleaning solution containing methanol, alcohol or other suitable organic or Inorganic solution. The cleaning solution may remove water and materials having weak molecular bonds with the substrate surface. The weak molecular bonded material, water and surface impurities may be rinsed away and removed while leaving the dopant monolayer 312 on the substrate surface for later processing. Subsequently, a nitrogen dry process may be utilized to dry out the substrate.

Figure 3D:
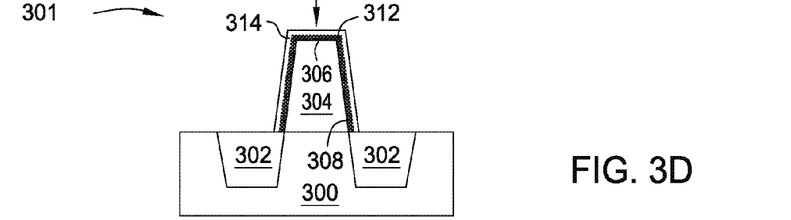

At step 208, a capping layer 314 is deposited on the dopant monolayer 312, as shown in FIG. 3D. The capping layer 314 is intended to inhibit the outgassing of the dopants found in the dopant monolayer 312 during subsequent steps. Additionally, the capping layer 314 inhibits dopants, such as phosphorus (P) or arsenic (As), from desorbed from the substrate surface during the subsequently thermal annealing process. In one embodiment, the capping layer 314 may be dielectric material selected from a group consisting of silicon oxide ($SiO_2$), silicon nitride ($Si_3N_4$), silicon oxynitride (SiON), aluminum oxide ($Al_2O_3$), aluminum nitride (AlN), or any other suitable dielectric material. The capping layer 314 can be formed using any one or more depositions techniques, such as atomic layer deposition (ALD), cyclical layer deposition (CLAD), physical vapor deposition (PVD), chemical vapor deposition (CVD), plasma enhanced chemical vapor deposition (PECVD), evaporation, for example. In one embodiment, the capping layer 314 described herein is a silicon oxide layer having a thickness between about 1 nm and about 10 nm.

Figure 3E:
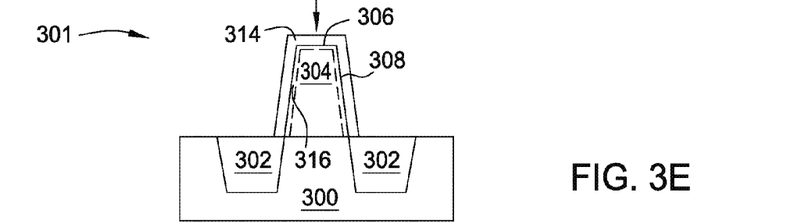

At step 210, a thermal annealing process is performed on the substrate in a thermal processing chamber to drive and/or diffuse the dopants in the dopant monolayer 312 into the semiconductor fin 304 to form a doped region 316 therein, as shown in FIG. 3E. Examples of thermal processing chambers that may be adapted to benefit from the invention are XEplus and RadiancePlus™ CENTURA® thermal processing system, both available from Applied Material, Inc., located in Santa Clara, Calif. The thermal annealing process may be millisecond/nanosecond annealing (MSA/NSA) or rapid thermal annealing (RTA). The temperature, process time and the gas supplied during the thermal annealing process may be adjusted according to the device performance requirement so as to drive the dopants into the semiconductor fin 304 to a desired junction depth.

In one embodiment, the thermal annealing process performed at step 210 may have a temperature range between about 900 degrees Celsius and about 1300 degrees Celsius, such as between about 1150 degrees Celsius and about 1200 degrees Celsius. During the thermal annealing process, a gas mixture including at least a nitrogen containing gas is supplied into the annealing chamber. The nitrogen containing gas supplied into the annealing chamber at a flow rate between about 50 sccm and about 150 sccm, controlling a chamber pressure of about 700 mTorr and about 1000 mTorr. Suitable examples of the nitrogen containing gas include nitrogen gas, ammonia gas, or nitrogen oxide. In one particular embodiment described herein, the nitrogen containing gas is a nitrogen gas ($N_2$). After the thermal annealing process, the doping concentration in the doped region 316 may be about $1 \times 10^{19}$ atoms/cm$^3$ and about $2 \times 10^{20}$ atoms/cm$^3$, and have a depth between about 1 nm and about 50 nm.

Figure 3F:
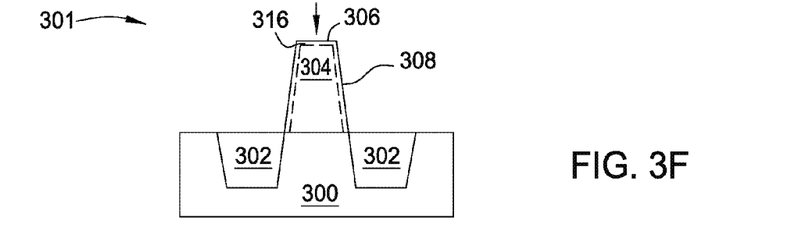

After the doped region 316 is formed in the semiconductor fin 304, optionally the capping layer 314 may be then removed from the substrate 300, as shown in FIG. 3F. Suitable technique that may be utilized to remove the capping layer 314 may include an etching process including dry process or wet process, a polishing process, or any suitable process as needed.

Thus, methods for forming a conformal dopant monolayer on a substrate so as to form a doped semiconductor region on a substrate are provided. The method advantageously forms a dopant monolayer on a substrate in a conformal and uniform manner so that a known and/or repeatable amount of dopants can be conformally and uniformly doped into the substrate having a closely packed structure or having high aspect ratio features formed thereon. The conformal dopants doped into the substrate may form desired shadow junction for next generation FinFET junction scaling, thereby improving the overall electrical device performance.

While the foregoing is directed to embodiments of the present invention, other and further embodiments of the invention can be devised without departing from the basic scope thereof, and the scope thereof is determined by the claims that follow.

The invention claimed is:

1. A method for forming a semiconductor device on a substrate, comprising:
   forming a charged layer on a silicon containing surface disposed on a substrate by immersing the substrate into a first treatment solution including aminosilane, wherein the charged layer has a first charge; and
   forming a dopant monolayer on the charged layer, wherein dopants formed in the dopant monolayer include at least one of a group III or group V atoms.

2. The method of claim 1, further comprising:
   forming a capping layer on the dopant monolayer.

3. The method of claim 2, further comprising:
   diffusing dopants from the dopant monolayer into the substrate to form a doped region on the substrate.

4. The method of claim 3, wherein diffusing the dopants comprises:
   heating the substrate to a temperature between about 900 degrees Celsius and about 1300 degrees Celsius.

5. The method of claim 3, wherein the doped region has a dopant concentration between about $1 \times 10^{19}$ atoms/cm$^3$ and about $2 \times 10^{20}$ atoms/cm$^3$.

6. The method of claim 2, wherein the capping layer is a dielectric layer.

7. The method of claim 1, further comprising:
rinsing the substrate with a cleaning solution after forming the dopant monolayer, wherein the cleaning solution includes methanol.

8. The method of claim 1, wherein the silicon containing surface includes a semiconductor fin utilized to form a FinFET device.

9. The method of claim 1, forming a dopant monolayer on the charged layer further comprises:
immersing the substrate in a second treatment solution, wherein the second treatment solution includes the group III or group V atoms to form the dopant monolayer on the substrate surface.

10. The method of claim 1, wherein the substrate is pre-cleaned and forms a hydroxylation surface to absorb molecules from the first treatment process prior to forming the charged layer on the silicon containing surface on the substrate.

11. A method for forming a semiconductor device on a substrate comprising:
immersing a substrate having a semiconductor fin formed thereon in a first treatment solution containing aminosilane;
immersing the substrate in a second treatment solution containing group III or group V anions to form a dopant monolayer on the substrate;
forming a capping layer on the dopant monolayer; and
performing a thermal annealing process on the substrate.

12. The method of claim 11, wherein immersing the substrate in the first treatment solution further comprises:
forming a positive charge layer on the semiconductor fin on the substrate wherein the positive charge layer provides cations to be absorbed with the group III or group V anions in the second treatment solution.

13. The method of claim 11, wherein performing the thermal annealing process further comprises:
diffusing dopants in the dopant monolayer into the semiconductor fin to form a doped region in the semiconductor fin.

14. A method for forming a dopant monolayer on a substrate comprising:
forming a positive charge layer having cations on a semiconductor fin disposed on a substrate;
disposing a treatment solution on the positive charge layer to form a dopant monolayer on the positive charge layer, wherein the treatment solution comprises anions; and
forming a capping layer on the dopant monolayer that comprises the cations and the anions.

15. The method of claim 14, further comprising:
thermal annealing the substrate to diffuse dopants from the dopant monolayer into the substrate.

16. The method of claim 15, further comprising:
forming a doped region that includes the dopants from the dopant monolayer.

17. The method of claim 14, wherein the substrate is pre-cleaned prior to forming the positive charge layer on the substrate.

18. The method of claim 14, wherein the substrate is rinsed with a solution containing methanol or alcohol after the dopant monolayer is formed on the substrate.

* * * * *

UNITED STATES PATENT AND TRADEMARK OFFICE
CERTIFICATE OF CORRECTION

PATENT NO.         : 9,490,125 B2                                        Page 1 of 1
APPLICATION NO.    : 14/758784
DATED              : November 8, 2016
INVENTOR(S)        : Roman Gouk et al.

It is certified that error appears in the above-identified patent and that said Letters Patent is hereby corrected as shown below:

In the Specification

In Column 4, Line 33, delete "301" and insert -- SOI --, therefor.

In Column 7, Line 32, delete "Inorganic" and insert -- inorganic --, therefor.

In Column 7, Line 54, delete "(CLAD)," and insert -- (CLD), --, therefor.

Signed and Sealed this
Fourteenth Day of March, 2017

Michelle K. Lee
*Director of the United States Patent and Trademark Office*